United States Patent
Goldfarb

(10) Patent No.: US 8,324,966 B2
(45) Date of Patent: Dec. 4, 2012

(54) APPARATUS AND METHODS FOR ELECTRONIC AMPLIFICATION

(75) Inventor: Marc Goldfarb, Atkinson, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/073,708

(22) Filed: Mar. 28, 2011

(65) Prior Publication Data

US 2012/0249242 A1    Oct. 4, 2012

(51) Int. Cl.
*H03F 3/68* (2006.01)
(52) U.S. Cl. .................................. 330/124 R; 330/295
(58) Field of Classification Search ............... 330/124 R, 330/295, 253
See application file for complete search history.

(56) References Cited

U.S. PATENT DOCUMENTS

| | | |
|---|---|---|
| 4,980,810 A | 12/1990 | McClanahan et al. |
| 5,121,084 A | 6/1992 | Anderson et al. |
| 5,867,061 A | 2/1999 | Rabjohn et al. |
| 6,650,180 B2 | 11/2003 | Lautzenhiser et al. |
| 6,683,499 B2 | 1/2004 | Lautzenhiser et al. |
| 6,690,238 B2 | 2/2004 | Lautzenhiser et al. |
| 6,747,517 B2 | 6/2004 | Lautzenhiser et al. |
| 6,900,696 B2 | 5/2005 | Lautzenhiser et al. |
| 6,922,106 B2 | 7/2005 | Lautzenhiser et al. |
| 7,053,718 B2 | 5/2006 | Dupuis et al. |
| 7,190,229 B1 | 3/2007 | Lautzenhiser et al. |
| 7,215,206 B2 | 5/2007 | Dupuis et al. |
| 7,570,116 B2 | 8/2009 | Haila et al. |
| 7,944,307 B2 * | 5/2011 | Goldfarb et al. ............... 330/295 |
| 7,991,375 B2 * | 8/2011 | Afsahi ........................... 455/320 |
| 8,035,445 B2 * | 10/2011 | Gomez et al. ............. 330/124 R |
| 8,115,554 B2 * | 2/2012 | Ng et al. ........................ 330/295 |
| 2007/0194804 A1 | 8/2007 | Kase et al. |
| 2008/0024229 A1 | 1/2008 | Dupuis et al. |
| 2010/0301943 A1 | 12/2010 | Goldfarb |

FOREIGN PATENT DOCUMENTS

| | | |
|---|---|---|
| CA | 2374784 | 6/2003 |
| CA | 2374794 | 6/2003 |

* cited by examiner

*Primary Examiner* — Henry Choe
(74) *Attorney, Agent, or Firm* — Knobbe Martens Olson & Bear LLP

(57) ABSTRACT

Apparatus and methods for electronic amplification are provided. In one embodiment, a method includes providing a first differential amplification block, providing a second differential amplification block, electrically connecting the first and second differential amplification blocks in a stack between a first voltage reference and a second voltage reference, amplifying a first signal using the first differential amplification block, and amplifying a second signal using the second differential amplification block. A voltage difference between the first and second voltage references defines a power supply voltage, and the first differential amplification block operates over a first range of the power supply voltage and the second differential amplification block operates over a second range of the power supply voltage.

21 Claims, 11 Drawing Sheets

APPARATUS AND METHODS FOR ELECTRONIC AMPLIFICATION

CROSS-REFERENCE TO RELATED APPLICATIONS

This application is related to commonly-owned U.S. patent application Ser. No. 12/407,148, filed Mar. 19, 2009, titled "WIDEBAND RF AMPLIFIERS," and to commonly-owned U.S. patent application Ser. No. 12/473,697, filed May 28, 2009, titled "HIGH VOLTAGE AMPLIFICATION USING LOW BREAKDOWN VOLTAGE DEVICES."

BACKGROUND

1. Field

Embodiments of the invention relate to electronic devices, and more particularly, to amplifiers.

2. Description of the Related Technology

Certain electronic systems, such as mixers, modulators and/or demodulators, can include an amplifier for amplifying a relatively weak signal. For example, a local oscillator may be unable to generate a clock signal having a relatively large voltage swing over a wide range of frequencies, and an amplifier can be used to amplify the clock signal to generate an amplified clock signal.

Various operational parameters of an amplifier can impact the overall performance of an electronic system using the amplifier. For example, DC current consumption of the amplifier can impact overall energy efficiency of the system, while the third order intercept point (IP3) of the system can be affected by the bandwidth of the amplifier. Furthermore, the common mode rejection ratio (CMRR), power conversion gain, spurious free dynamic range (SFDR), and/or various other parameters of the amplifier can impact the performance of the system.

There is a need for improved amplifiers. Furthermore, there is a need for amplifiers having reduced power consumption, increased bandwidth, and/or an improved CMRR.

SUMMARY

In one embodiment, an apparatus includes a first stacked differential amplifier stage having a non-inverted input, an inverted input, a non-inverted output and an inverted output. The amplifier stages includes a first amplification subcircuit, a second amplification subcircuit, a third amplification subcircuit, and a fourth amplification subcircuit. The first and second amplification subcircuits are arranged as a first differential amplification block, and the third and fourth amplification subcircuits are arranged as a second differential amplification block. Each amplification subcircuit is configured to receive an input signal as an input and to generate an amplified version of the input signal as an output, and the first and second amplification subcircuits are electrically powered in the first differential amplification block and the third and fourth amplification subcircuits are electrically powered in the second differential amplification block such that the first and second amplification subcircuits operate from a first portion of a power supply voltage and the third and fourth amplification subcircuits operate from a second portion of the power supply voltage. The second portion of the power supply voltage is different from the first portion. The inputs of the first and fourth amplification subcircuits are electrically connected to the inverted input, and the inputs of the second and third amplification subcircuits are electrically connected to the non-inverted input. The outputs of the first and fourth amplification subcircuits are electrically connected to the one of the non-inverted output or the inverted output, and the outputs of the second and third amplification subcircuits are electrically connected to the other one of the inverted output or the non-inverted output.

In another embodiment, a method for amplifying a signal is provided. The method includes providing a first differential amplification block, providing a second differential amplification block, and electrically coupling the first and second differential amplification blocks in series between a first voltage reference and a second voltage reference. A voltage difference between the first and second voltage references defines a power supply voltage. The method further includes amplifying a first signal using the first differential amplification block and amplifying a second signal using the second differential amplification block. The first differential amplification block operates over a first range of the power supply voltage and the second differential amplification block operates over a second range of the power supply voltage, the second range different from the first range.

DETAILED DESCRIPTION OF EMBODIMENTS

Figure 1:
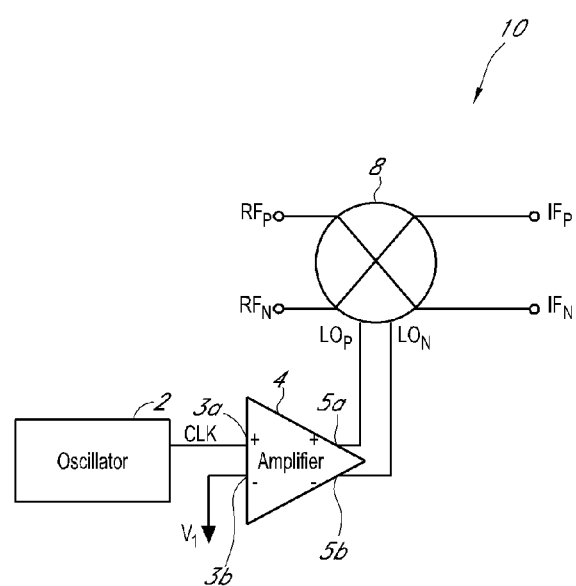
FIG. 1 is a schematic diagram of one example of an electronic system including an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of One Example of an Electronic System Including an Amplifier

FIG. 1 is a schematic diagram of one example of an electronic system 10. The electronic system 10 includes an oscillator 2, an amplifier 4, and a mixer 8.

The local oscillator 2 can be used to generate a clock signal CLK having a particular frequency. For example, the local oscillator 2 can be used to generate a clock signal CLK for down converting a radio frequency signal from a carrier frequency to an intermediate frequency. In one implementation, the clock signal CLK has a frequency ranging between about 10 MHz to about 5 GHz.

The illustrated electronic system 10 includes the amplifier 4 for amplifying the clock signal CLK generated by the oscillator 2. For example, the clock signal CLK may not have an amplitude that is sufficient for use by the mixer 8, and the amplifier 4 can be used to boost the amplitude of the clock signal CLK to a sufficient level. The amplifier 4 can alternatively be used for other functions in addition to amplification, such as the conversion of a single-ended signal to a differential signal. For example, the oscillator 2 and the mixer 8 can be disposed on separate integrated circuits (ICs) and may communicate over a single-ended interface, and the amplifier 4 can be used to convert a single-ended clock signal to generate an amplified differential clock signal suitable for use by the mixer 8 or other component of the electronic system 10.

The amplifier 4 includes a positive or non-inverted input 3a and a negative or inverted input 3b, which collectively form a differential input. The amplifier 4 also includes a positive or non-inverted output 5a and a negative or inverted output 5b, which collectively form a differential output.

The non-inverted input 3a of the amplifier 4 is configured to receive the clock signal CLK from the oscillator 2, and the inverted input 3b of the amplifier 4 is electrically connected to a first voltage reference $V_1$. The amplifier 4 can amplify a difference between the clock signal CLK and the first voltage reference $V_1$ to generate a positive or non-inverted amplified clock signal $LO_P$ and a negative or inverted amplified clock signal $LO_N$, which collectively form an amplified differential clock signal.

It can be desirable for the amplifier 4 to have a relatively high common mode rejection ratio (CMRR). For example, providing a relatively high CMRR for the amplifier 4 can aid in improving signal balance of a differential output signal when using the amplifier 4 to convert a single-ended input to a differential output.

The mixer 8 can receive a positive or non-inverted RF input signal $RF_P$ and a negative or inverted RF input signal $RF_N$, which collectively form a differential RF input voltage. The mixer 8 can be configured to multiply the differential RF input voltage $RF_P$, $RF_N$ by the amplified differential clock signal $LO_P$, $LO_N$ to generate a non-inverted intermediate frequency signal $IF_P$ and an inverted intermediate frequency signal $IF_N$, which collectively form a differential intermediate frequency signal. Although not illustrated in FIG. 1, the differential intermediate frequency signal $IF_P$, $IF_N$ can be provided to other components within the electronic system 10 and/or provided as outputs to the electronic system 10.

Figure 2:
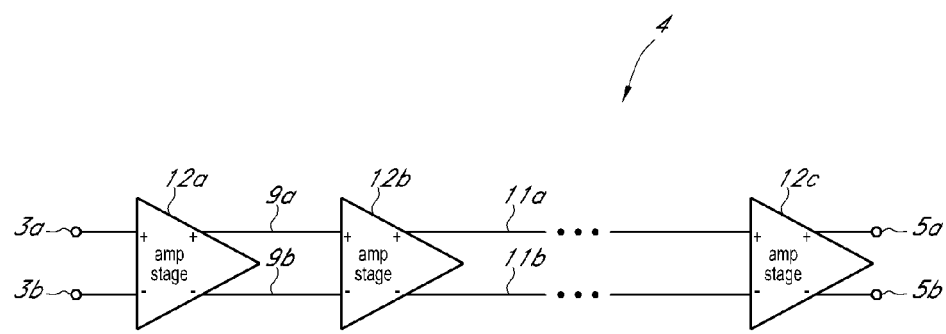
FIG. 2 is a schematic diagram of one example of an amplifier.

FIG. 2 is a schematic diagram of one example of an amplifier 4. The amplifier 4 includes a first stage 12a, a second stage 12b, a third stage 12c, a non-inverted input 3a, an inverted input 3b, a non-inverted output 5a, and an inverted output 5b. The amplifier 4 can amplify a difference between a signal received on the non-inverted and inverted inputs 3a, 3b to generate an amplified signal on the non-inverted and inverted outputs 5a, 5b.

The first stage 12a includes a non-inverted input and an inverted input electrically connected to the non-inverted and inverted inputs 3a, 3b, respectively. The first stage 12a further includes a non-inverted output and an inverted output for providing first amplified non-inverted and inverted signals 9a, 9b, respectively. The first stage 12a can amplify a difference between the non-inverted and inverted inputs 3a, 3b to generate the first amplified non-inverted and inverted signals 9a, 9b.

Similarly, the second stage 12b includes a non-inverted input and an inverted input for receiving the first amplified non-inverted and inverted signals 9a, 9b, respectively. The second stage 12b further includes a non-inverted output and an inverted output for providing second amplified non-inverted and inverted signals 11a, 11b, respectively. The second stage 12b can amplify a difference between the first amplified non-inverted and inverted signals 9a, 9b to generate the second amplified non-inverted and inverted signals 11a, 11b. Likewise, the third stage 12c includes a non-inverted input and an inverted input for receiving the second amplified non-inverted and inverted signals 11a, 11b, respectively. The third stage 12c further includes a non-inverted output and an inverted output electrically connected to the non-inverted and inverted outputs 5a, 5b, respectively. The third stage 12c can amplify a difference between the second amplified non-inverted and inverted signals 11a, 11b to generate a differential output signal on the non-inverted and inverted outputs 5a, 5b.

By using a plurality of amplifier stages, such as the amplifier stages 12a-12c, a desired overall gain for the amplifier 4 can be achieved. For example, the gain from a single amplifier stage may be insufficient for certain applications, so a plurality of amplifier stages can be cascaded to obtain a desired overall gain. Additionally, using a plurality of stages in an amplifier can aid in increasing the input resistance and/or reducing the output resistance of the amplifier 4 relative to a design using a single stage. Furthermore, a plurality of amplifier stages can be used to raise the output signal of the amplifier 4 to a level where the output signal has a relatively small variation in response to variations in the DC voltage level at the input. Moreover, a plurality of amplifier stages can aid in generating a hard limited output voltage signal, such as a square wave, that is suitable for certain applications, such as rapid mixer switching. Additionally, the addition of differential amplifier stages at the input of amplifier 4 improves the overall CMRR of the amplifier. Although FIG. 2 illustrates a case in which three stages have been used, the amplifier 4 can include more or fewer stages.

Overview of Amplifiers Including One or More Differential Stacked Amplifier Stages In certain embodiments described herein, amplifiers having one or more differential stacked amplifier stages are provided. The differential stacked amplifier stages can include differential amplification blocks electrically connected in series between two voltage references. By stacking the differential amplification blocks in this manner, the differential amplification blocks can share all or part of a bias current. Additionally, stacking the differential amplification blocks permits the amplification blocks to operate over different ranges of voltage, which can aid in improving the bandwidth of the amplifier stage by reducing voltage swing and allowing the use of thin gate oxide transistors having a relatively small parasitic capacitance. For example, even when a power supply voltage has a magnitude greater than a breakdown voltage of a thin oxide transistor, each stacked differential amplification block can be configured to operate over a portion of the power supply voltage having a magnitude less than the breakdown voltage of the thin-oxide transistor.

Figure 3A:
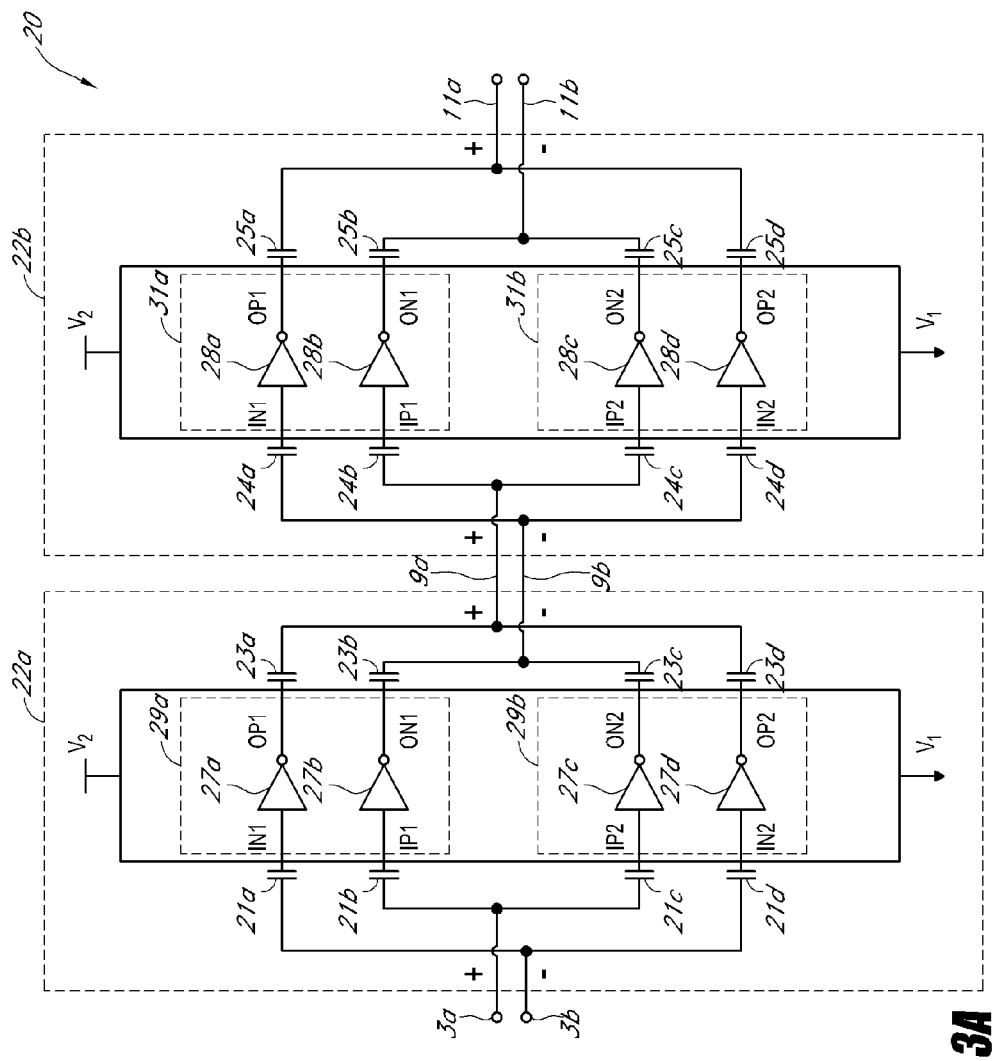
FIG. 3A is a schematic diagram of an amplifier in accordance with one embodiment.

FIG. 3A is a schematic diagram of an amplifier 20 in accordance with one embodiment. The amplifier 20 includes a first differential stacked amplifier stage 22a and a second differential stacked amplifier stage 22b. The first differential stacked amplifier stage 22a includes a non-inverted input and an inverted input configured to operate as the non-inverted and inverted inputs 3a, 3b of the amplifier 20, respectively. The first differential stacked amplifier stage 22a further includes a non-inverted output and an inverted output for generating first amplified non-inverted and inverted signals 9a, 9b, respectively. The second stage 22b includes a non-inverted input and an inverted input for receiving the first amplified non-inverted and inverted signals 9a, 9b, respectively. The second stage 22b further includes a non-inverted output and an inverted output for generating second amplified non-inverted and inverted signals 11a, 11b, respectively. The second amplified non-inverted and inverted signals 11a, 11b can be used as outputs of the amplifier 20 or provided to another stage of the amplifier. Although the illustrated amplifier 20 includes two stages, persons having ordinary skill in the art will appreciate that the amplifier 20 can be modified to have more or fewer stages, including stages of the same and/or of a different type.

The first differential stacked amplifier stage 22a includes a first plurality of capacitors 21a-21d, a first plurality of amplification subcircuits 27a-27d, and a second plurality of capacitors 23a-23d. The second differential stacked amplifier stage 22b includes a third plurality of capacitors 24a-24d, a second plurality of amplification subcircuits 27a-27d, and a fourth plurality of capacitors 25a-25d. The first plurality of amplification subcircuits 27a-27d includes a first amplification subcircuit 27a, a second amplification subcircuit 27b, a third amplification subcircuit 27c, and a fourth amplification subcircuit 27d. The first and second amplification subcircuits 27a, 27b operate as a first differential amplification block 29a, while the third and fourth amplification subcircuits 27c, 27d operate as a second differential amplification block 29b. Similarly, the second plurality of amplification subcircuits 28a-28d includes a first amplification subcircuit 28a, a second amplification subcircuit 28b, a third amplification subcircuit 28c, and a fourth amplification subcircuit 28d. The first and second amplification subcircuits 28a, 28b operate as a first differential amplification block 31a, while the third and fourth amplification 28c, 28d subcircuits operate as a second differential amplification block 31b.

The first plurality of capacitors 21a-21d includes a first capacitor 21a, a second capacitor 21b, a third capacitor 21c, and a fourth capacitor 21d. The first capacitor 21a includes a first end electrically connected to the inverted input 3b, and a second end electrically connected to an input of the first amplification subcircuit 27a or IN1. The second capacitor 21b includes a first end electrically connected to the non-inverted input 3a, and a second end electrically connected to an input of the second amplification subcircuit 27b or IP1. The third capacitor 21c includes a first end electrically connected to the non-inverted input 3a, and a second end electrically connected to an input of the third amplification subcircuit 27c or IP2. The fourth capacitor 21d includes a first end electrically connected to the inverted input 3b, and a second end electrically connected to an input of the fourth amplification subcircuit 27d or IN2.

The second plurality of capacitors 23a-23d includes a first capacitor 23a, a second capacitor 23b, a third capacitor 23c, and a fourth capacitor 23d. The first capacitor 23a includes a first end electrically connected to an output of the first amplification subcircuit 27a or OP1. The second capacitor 23b includes a first end electrically connected to an output of the second amplification subcircuit 27b or ON1. The third capacitor 23c includes a first end electrically connected to an output of the third amplification subcircuit 27c or ON2. The fourth capacitor 23d includes a first end electrically connected to an output of the fourth amplification subcircuit 27d or OP2. The first capacitor 23a further includes a second end electrically connected to a second end of the fourth capacitor 23d to generate the first amplified non-inverted signal 9a. The second capacitor 23b further includes a second end electrically connected to a second end of the third capacitor 23c to generate the first amplified inverted signal 9b.

The amplification subcircuits 27a-27d are electrically connected in a stack between a first voltage reference $V_1$ and a second voltage reference $V_2$. The first and second voltage references $V_1$, $V_2$ can be, for example, positive and negative voltage references, respectively, and a difference between the voltage references $V_1$, $V_2$ can represent a power supply voltage. In another example, the first voltage reference $V_1$ can correspond to a positive voltage, and the second voltage reference $V_2$ can correspond to ground. The first and second amplification subcircuits 27a, 27b can operate as a first differential amplification block 29a, and the third and fourth amplification subcircuits 27c, 27d can operate as a second differential amplification block 29b, and the first and second differential amplification blocks 29a, 29b can be electrically connected in series between the first and second voltage references $V_1$, $V_2$. Thus, the first and second amplification subcircuits 27a, 27b can be positioned above the third and fourth amplification subcircuits 27c, 27d, such that the first and second amplification subcircuits 27a, 27b operate over a first portion of the power supply voltage and the third and fourth amplification subcircuits 27c, 27d operate over a second portion of the power supply voltage. By stacking the amplification subcircuits 27a-27d in this manner, power consumption can be reduced and a relatively high common mode rejection ratio (CMRR) can be achieved, as will be described in detail below.

The third plurality of capacitors 24a-24d includes a first capacitor 24a, a second capacitor 24b, a third capacitor 24c, and a fourth capacitor 24d. The first capacitor 24a includes a first end electrically connected to the first inverted amplified signal 9b and a second end electrically connected to an input of the first amplification subcircuit 28a or IN1. The second capacitor 24b includes a first end electrically connected to the first non-inverted amplified signal 9a and a second end electrically connected to an input of the second amplification subcircuit 28b or IP1. The third capacitor 24c includes a first end electrically connected to the first non-inverted amplified signal 9a and a second end electrically connected to an input of the third amplification subcircuit 28c or IP2. The fourth capacitor 24d includes a first end electrically connected to the inverted amplified signal 9b and a second end electrically connected to an input of the fourth amplification subcircuit 28d or IN2.

The fourth plurality of capacitors 25a-25d includes a first capacitor 25a, a second capacitor 25b, a third capacitor 25c, and a fourth capacitor 25d. The first capacitor 25a includes a first end electrically connected to an output of the first amplification subcircuit 28a or OP1. The second capacitor 25b includes a first end electrically connected to an output of the second amplification subcircuit 28b or ON1. The third capacitor 25c includes a first end electrically connected to an output of the third amplification subcircuit 28c or ON2. The fourth capacitor 25d includes a first end electrically connected to an output of the fourth amplification subcircuit 28d or OP2. The first capacitor 25a further includes a second end electrically connected to a second end of the fourth capacitor 25d to generate the second non-inverted amplified signal 11a. The second capacitor 25b further includes a second end electrically connected to a second end of the third capacitor 25c to generate the second inverted amplified signal 11b.

The amplification subcircuits 28a-28d can be arranged in a stack between the first voltage reference $V_1$ and the second voltage reference $V_2$, as was described above. The difference between the first and second voltage references $V_1$, $V_2$ can define a power supply voltage of the amplification subcircuits 28a-28d. Additionally, the first and second amplification subcircuits 28a, 28b can operate as a first differential amplification block 31a, and the third and fourth amplification subcircuits 28c, 28d can operate as a second differential amplification block 31b. The first and second amplification subcircuits 28a, 28b can be positioned above the third and fourth amplification subcircuits 28c, 28d in a stack such that the first and second amplification subcircuits 28a, 28b operate over a first portion of the power supply voltage and the third and fourth amplification subcircuits 28c, 28d operate over a second portion of a power supply voltage. For example, the first and second amplification subcircuits 28a, 28b can operate over a portion of the power supply voltage ranging between about the voltage of the second voltage reference $V_2$ to about half the difference between the voltage of the first and second voltage references $V_1$, $V_2$, and the third and fourth amplification subcircuits 28c, 28d can operate over a portion of the power supply voltage ranging between about the voltage of the first voltage reference $V_1$ and about half the difference between the voltage of the first and second voltage references $V_1$, $V_2$.

Providing differential stacked amplifier stages can aid in increasing the dynamic range of the amplifier 4 (FIG. 2), thereby aiding in amplifying signals in a noisy environment. Additionally, as will be described in detail below, by stacking the amplifier stages, the DC current consumed in biasing the amplifier stages can be reduced relative to a configuration in which stages are not stacked.

Although FIG. 3A illustrates a case where the non-inverted and inverted outputs of the first differential stacked amplifier stage 22a are electrically connected to the non-inverted and inverted inputs of the second differential stacked amplifier stage 22b, respectively, in an alternative configuration, the non-inverted and inverted outputs of the first differential stacked amplifier stage 22a can be electrically connected to the inverted and non-inverted inputs of the second differential stacked amplifier stage 22b, respectively.

Figure 3B:
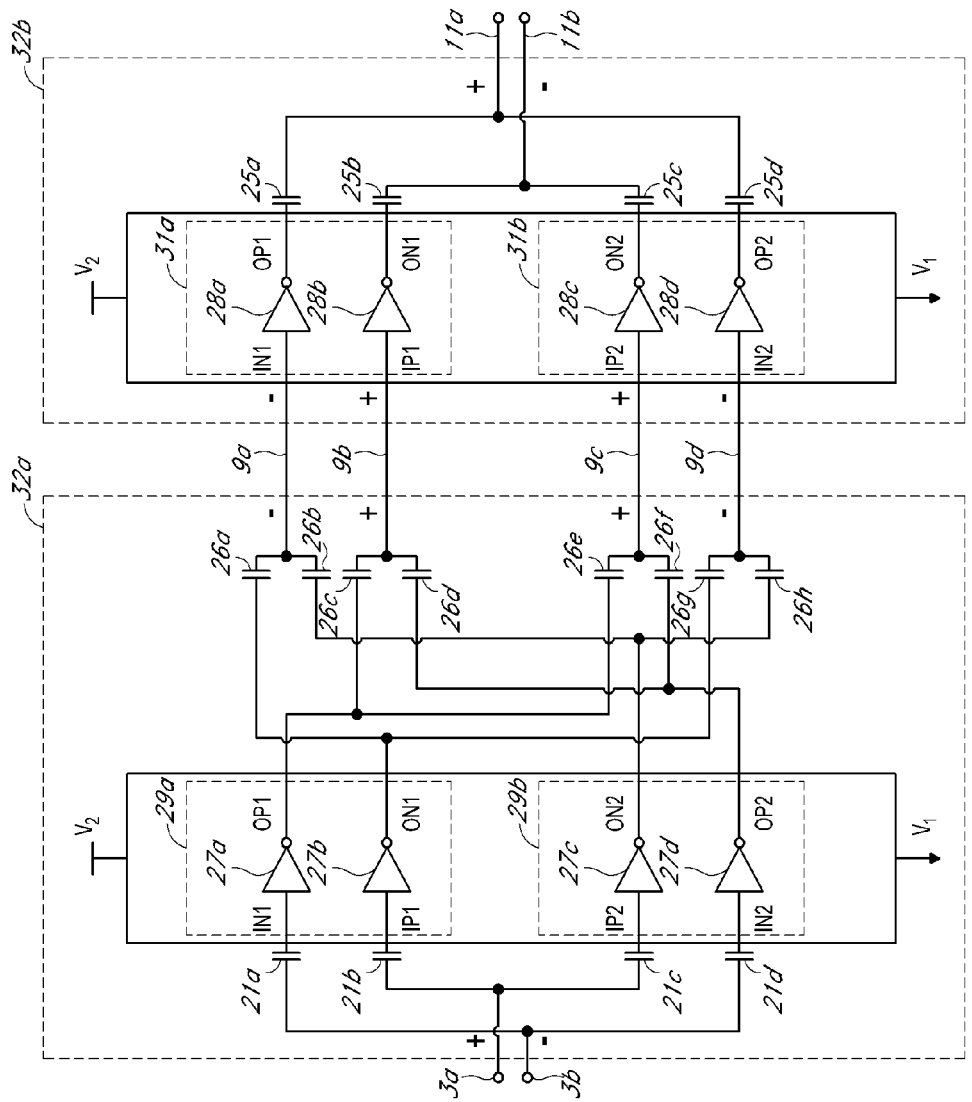
FIG. 3B is a schematic diagram of an amplifier in accordance with another embodiment.

FIG. 3B is a schematic diagram of an amplifier 30 in accordance with another embodiment. The amplifier 30 includes a first differential stacked amplifier stage 32a and a second differential stacked amplifier stage 32b. The first differential stacked amplifier stage 32a includes a non-inverted input and an inverted input configured to operate as non-inverted and inverted inputs 3a, 3b of the amplifier 30, respectively. The first differential stacked amplifier stage 32a further includes outputs for generating first amplified non-inverted signals 13b, 13c and for generating first amplified inverted signals 13a, 13d. The second stage 32b includes non-inverted inputs for receiving the first amplified non-inverted signals 13a, 13d and inverted inputs for receiving the first amplified inverted signals 13b, 13c. The second stage 32b further includes a non-inverted output and an inverted output for providing second amplified non-inverted and inverted signals 11a, 11b, respectively.

The first differential stacked amplifier stage 32a includes a first plurality of capacitors 21a-21d, a first plurality of amplification subcircuits 27a-27d, and a second plurality of capacitors 26a-26h. The second differential stacked amplifier stage 32b includes a second plurality of amplification subcircuits 28a-28d and a third plurality of capacitors 25a-25d. The first plurality of amplification subcircuits 27a-27d and the second plurality of amplification subcircuits 28a-28d can each be electrically connected in a stack as was described above with respect to the amplifier 20 of FIG. 3A. However, in contrast to the amplifier 20 of FIG. 3A, the amplifier 30 of FIG. 3B has used a different arrangement of capacitors to provide inter-stage coupling between the amplifier stages. For example, the differential stacked amplifier stages 22a, 22b of FIG. 3A have been electrically coupled using capacitors arranged in a star configuration, while the differential stacked amplifier stages 32a, 32b of FIG. 3B have been electrically coupled using capacitors arranged in a bridge configuration, as will be described below.

The second plurality of capacitors 26a-26h includes a first capacitor 26a, a second capacitor 26b, a third capacitor 26c, a fourth capacitor 26d, a fifth capacitor 26e, a sixth capacitor 26f, a seventh capacitor 26g, and an eighth capacitor 26h.

The output of the first amplification subcircuit 27a is electrically connected to a first end of the first third capacitor 26c and to a first end of the fifth capacitor 26e, while the output of the second amplification subcircuit 27b is electrically connected to a first end of the first capacitor 26a and to a first end of the seventh capacitor 26g. The output of the third amplification subcircuit 27c is electrically connected to a first end of the second capacitor 26b and to a first end of the eighth capacitor 26h, while the output of the fourth amplification subcircuit 27d is electrically connected to a first end of the fourth capacitor 26d and to a first end of the sixth capacitor 26f.

The first capacitor 26a further includes a second end electrically connected to a second end of the second capacitor 26b to generate the inverted amplified signal 13a, which has been provided to the input of the first amplification subcircuit 28a or IN1. The third capacitor 26c further includes a second end electrically connected to a second end of the fourth capacitor 26d to generate the non-inverted amplified signal 13b, which has been provided to the input of the second amplification subcircuit 28b or IP1. Similarly, the fifth capacitor 26e further includes a second end electrically connected to a second end of the sixth capacitor 26f to generate the non-inverted amplified signal 13c, which has been provided to the input of the third amplification subcircuit 28c or IP2. The seventh capacitor 26g further includes a second end electrically connected to a second end of the eighth capacitor 26h to generate the inverted amplified signal 13d, which has been provided to the input of the fourth amplification subcircuit 28d or IN2.

As illustrated by FIGS. 3A-3B, amplifier stages can be electrically coupled using a variety of techniques. Persons having ordinary skill in the art will appreciate that the stages can be electrically coupled using any suitable technique. Additional details of the amplifier 30 of FIG. 3B can be similar to those described above with respect to the amplifier 20 of FIG. 3A.

Figure 4A:
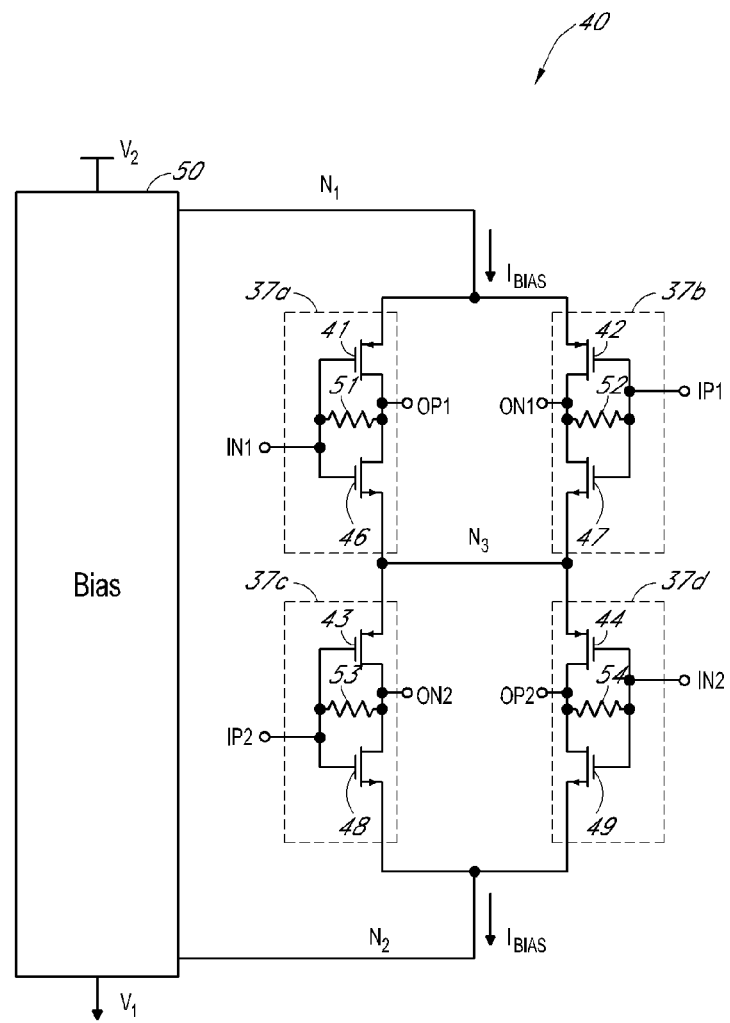
FIG. 4A is a circuit diagram of a differential stacked amplifier stage in accordance with one embodiment.

FIG. 4A is a circuit diagram of a differential stacked amplifier stage 40 in accordance with one embodiment. The differential stacked amplifier stage 40 includes a first amplification subcircuit 37a, a second amplification subcircuit 37b, a third amplification subcircuit 37c, a fourth amplification subcircuit 37d, and a bias circuit 50.

The first amplification subcircuit 37a includes a first PMOS transistor 41, a first NMOS transistor 46 and a first resistor 51, and the second amplification subcircuit 37b includes a second PMOS transistor 42, a second NMOS transistor 47, and a second resistor 52. The third amplification subcircuit 37c includes a third PMOS transistor 43, a third NMOS transistor 48, and a third resistor 53, and the fourth amplification subcircuit 37d includes a fourth PMOS transistor 44, a fourth NMOS transistor 49, and a fourth resistor 54. Each PMOS and NMOS transistor 41-44, 46-49 includes a gate, a drain and a source.

The gate of the first PMOS transistor 41 is electrically connected to a first end of the first resistor 51 and to the gate of the first NMOS transistor 46 at the input of the first amplification subcircuit 37a or IN1. The drain of the first PMOS transistor 41 is electrically connected to a second end of the first resistor 51 and to the drain of the first NMOS transistor 46 at the output of the first amplification subcircuit 37a or OP1. Similarly, the gate of the second PMOS transistor 42 is electrically connected to a first end of the second resistor 52 and to the gate of the second NMOS transistor 47 at the input of the second amplification subcircuit 37b or IP1. The drain of the second PMOS transistor 42 is electrically connected to a second end of the second resistor 52 and to the drain of the second NMOS transistor 47 at the output of the second amplification subcircuit 37b or ON1. The gate of the third PMOS transistor 43 is electrically connected to a first end of the third resistor 53 and to the gate of the third NMOS transistor 48 at the input of the third amplification subcircuit 37c or IP2. The drain of the third PMOS transistor 43 is electrically connected to a second end of the third resistor 53 and to the drain of the third NMOS transistor 48 at the output of the third amplification subcircuit 37c or ON2. Similarly, the gate of the fourth PMOS transistor 44 is electrically connected to a first end of the fourth resistor 54 and to the gate of the fourth NMOS transistor 49 at the input of the fourth amplification subcircuit 37d or IN2. The drain of the fourth PMOS transistor 44 is electrically connected to a second end of the fourth resistor 54 and to the drain of the fourth NMOS transistor 49 at the output of the fourth amplification subcircuit 37d or OP2.

The sources of the first and second PMOS transistors 41, 42 are electrically connected to the bias circuit 50 at a first node labeled $N_1$, and the sources of the third and fourth NMOS transistors 48, 49 are electrically connected to the bias circuit 50 at a second node labeled $N_2$. Additionally, the sources of the first and second NMOS transistors 46, 47 are electrically connected to the sources of the third and fourth PMOS transistors 43, 44 at a third node labeled $N_3$.

The bias circuit 50 can be electrically connected between the first and second voltage references $V_1$, $V_2$, and can be configured to bias the amplification subcircuits 37a-37d by generating a bias current $I_{BIAS}$ from the node $N_1$ to the node $N_2$. The nodes $N_1$-$N_3$ can each have a DC bias voltage suitable to permit the first and second amplification subcircuits 37a, 37b to operate over a first range of voltage, and to permit the third and fourth amplification subcircuits 37c, 37d to operate over a second range of voltage. In one implementation, the difference between the first and second voltage references $V_2$, $V_1$ is in the range of about 2.5 V to about 5 V, and the first node $N_1$ is biased at a DC voltage ranging between about 1.375 V to about 3.75 V, the second node $N_2$ is biased at a DC voltage ranging between about 0.625 V to about 1.25 V, and the third node $N_3$ is biased at a DC voltage ranging between about 1.25 V to about 2.5 V.

The illustrated amplification subcircuits have been electrically connected in a stack. By stacking the amplification subcircuits 37a-37d, the amplification subcircuits 37c, 37d can share the bias circuit $I_{BIAS}$ with the amplification subcircuits 37a, 37b, thereby reducing DC current draw of the amplifier stage. Additionally, stacking the amplification subcircuits can provide a variety of additional benefits, such as permitting the use of transistors having a relatively thin gate oxide and breakdown voltage, which can have less capacitance and operate over a wider band of frequencies compared to thick gate oxide transistors. To aid in providing similar operation for the amplification subcircuits in both the top and bottom of the stack, in certain implementations the NMOS and PMOS transistors can have bodies biased at similar voltages. For example, the bodies of PMOS transistors 41-44 can be electrically connected to the sources of the PMOS transistors 41-44, respectively, and a triple well or other suitable process can be used to electrically connect the bodies of the first and second NMOS transistors 46, 47 to the node $N_3$ and the bodies of the third and fourth NMOS transistors 48, 49 to the node $N_2$.

The resistors 51-54 can aid in biasing the amplification subcircuits 37a-37d, respectively. For example, the first resistor 51 can be electrically connected between the input and the output of the first amplification subcircuit 37a, thereby permitting the input and output of the first amplification subcircuit 37a to have about the same DC bias voltage. Biasing the amplification subcircuits in this manner can aid in providing amplification subcircuits that can be self-biasing, which can aid in operating the amplification subcircuits across different voltage ranges of a power supply voltage.

Although not illustrated in FIG. 4A, the differential stacked amplifier stage 40 can include additional circuit elements, such as capacitors for coupling the differential stacked amplifier stage 40 to other circuitry. For example, capacitors can aid in biasing the amplification subcircuits 37a-37d, while permitting relatively high-frequency signals to reach the inputs of the amplification subcircuits and/or combine at the outputs of the amplification subcircuits to achieve the desired electrical connectivity of the amplifier stage.

In certain implementations, the input impedance of the bias circuit 50 at the nodes $N_1$ and $N_2$ can be relatively high. Configuring the bias circuit 50 to have a relatively high input impedance at the nodes $N_1$ and $N_2$ can aid in improving the common mode rejection ratio (CMRR) of the amplifier by reducing a variation of the bias current $I_{BIAS}$ with respect to a change in common mode input voltage.

Figure 4B:
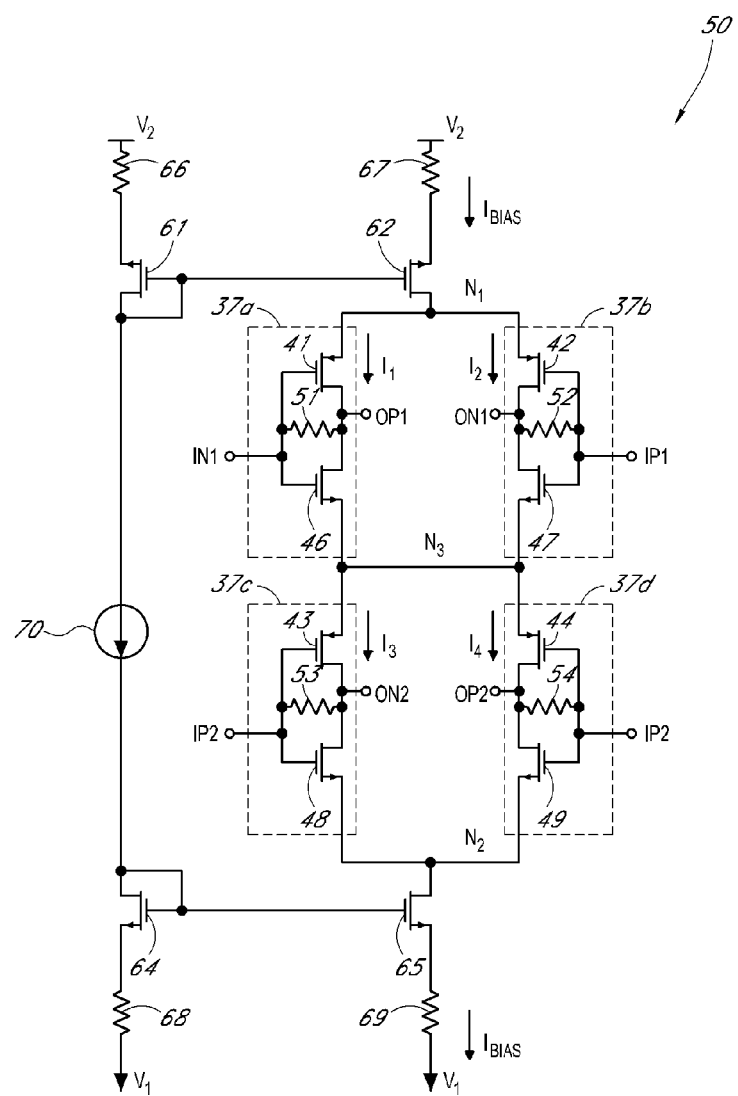
FIG. 4B is a circuit diagram of a differential stacked amplifier stage in accordance with another embodiment.

FIG. 4B is a circuit diagram of a differential stacked amplifier stage 55 in accordance with another embodiment. The differential stacked amplifier stage 55 includes a first amplification subcircuit 37a, a second amplification subcircuit 37b, a third amplification subcircuit 37c, and a fourth amplification subcircuit 37d, as was described above with respect to FIG. 4A. Additionally, the differential stacked amplifier stage 55 includes PMOS bias transistors 61, 62, NMOS bias transistors 64, 65, bias resistors 66-69, and a current source 70 for biasing the amplification subcircuits 37a-37d. The PMOS and NMOS bias transistors 61, 62, 64, 65 each include a gate, a drain, and a source.

The first bias resistor 66 includes a first end electrically connected to the second voltage reference $V_2$, and a second end electrically connected to the source of the first PMOS bias transistor 61. The gate and drain of the first PMOS bias transistor 61 are electrically connected to a first end of the current source 70 and to the gate of the second PMOS bias transistor or PMOS mirroring transistor 62. The second bias resistor 67 includes a first end electrically connected to the second voltage reference $V_2$ and a second end electrically connected to the source of the second PMOS bias transistor 62. The drain of the second PMOS bias transistor 62 is electrically connected to the first node $N_1$.

The third bias resistor 68 includes a first end electrically connected to the first voltage reference $V_1$, and a second end electrically connected to the source of the first NMOS bias transistor 64. The gate and drain of the first NMOS bias transistor 64 are electrically connected to a second end of the current source 70 and to the gate of the second NMOS bias transistor or NMOS mirroring transistor 65. The fourth bias resistor 69 includes a first end electrically connected to the first voltage reference $V_1$, and a second end electrically connected to the source of the second NMOS bias transistor 65. The drain of the second NMOS bias transistor 65 is electrically connected the second node $N_2$.

The bias resistors 66-69, NMOS bias transistors 64, 65, PMOS bias transistors 61, 62, and current source 70 can operate as a bias circuit for the amplification subcircuits 37a-37d. For example, the current source 70 can generate a current that can be mirrored using PMOS bias transistors 61, 62 and NMOS bias transistors 64, 65 to generate a bias current $I_{BIAS}$ for biasing amplification subcircuits 37a-37d. For example, a portion $I_1$ of the bias current $I_{BIAS}$ can be used to bias the first amplification subcircuit 37a, while a portion $I_2$ of the bias current $I_{BIAS}$ can be used to bias the second amplification subcircuit 37b. As illustrated in FIG. 4B, the current $I_{BIAS}$ can also be used to bias the third and fourth amplification subcircuits 37c, 37d. For example, the currents $I_1$ and $I_2$ can combine at the node $N_3$ and can be used to generate the currents $I_3$ and $I_4$ for biasing the third and fourth amplification subcircuits 37c, 37d, respectively.

As illustrated in FIG. 4B, by stacking the amplification subcircuits 37a-37d, a reduction in DC bias current can be achieved relative to a scheme in which the amplification subcircuits are not stacked and separate bias currents and/or biasing circuits are used.

Figure 4C:
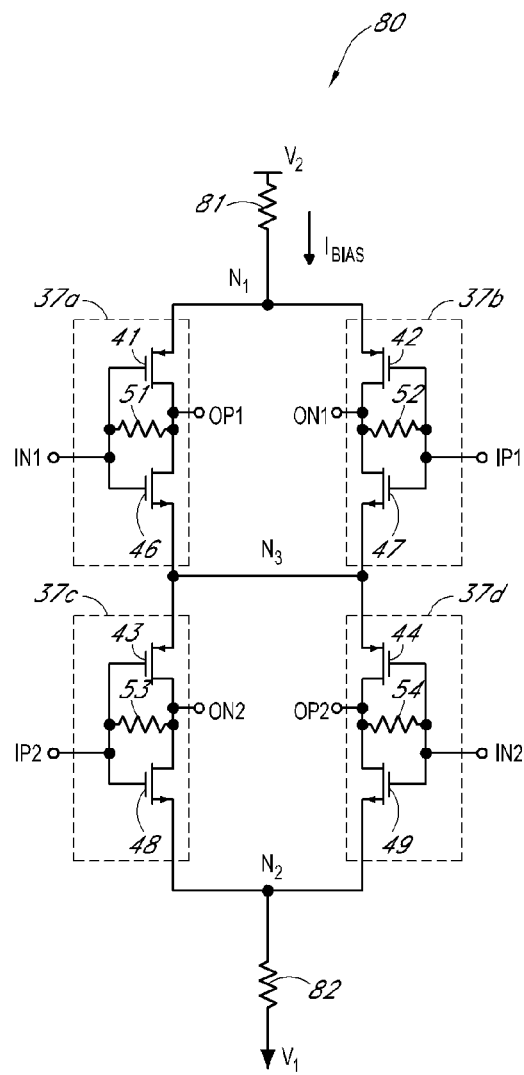
FIG. 4C is a circuit diagram of a differential stacked amplifier stage in accordance with yet another embodiment.

FIG. 4C is a circuit diagram of a differential stacked amplifier stage 80 in accordance with yet another embodiment. The differential stacked amplifier stage 80 includes a first amplification subcircuit 37a, a second amplification subcircuit 37b, a third amplification subcircuit 37c, and a fourth amplification subcircuit 37d, as was described above with respect to FIGS. 4A-4B. Additionally, the differential stacked amplifier stage 80 includes first and second bias resistors 81, 82 for biasing the amplification subcircuits 37a-37d. The differential stacked amplifier stage 80 includes a relatively simple biasing scheme using the first and second bias resistors 81, 82, and thus can have less biasing components and almost the same performance as the differential stacked amplifier stages of FIGS. 4A-4B.

The first bias resistor 81 includes a first end electrically connected to the second voltage reference $V_2$ and a second end electrically connected to the first node $N_1$. The second bias resistor 82 includes a first end electrically connected to the first voltage reference $V_1$ and a second end electrically connected to the second node $N_2$. The first and second bias resistors 81, 82 can aid in biasing the amplification subcircuits 37a-37d by generating a bias current $I_{BIAS}$ and establishing a DC bias voltage for the first and second nodes $N_1$, $N_2$. In certain implementations, the first and second bias resistors 81, 82 can operate as a bias circuit having a reduced component count and complexity relative to certain other bias circuits.

Figure 5A:
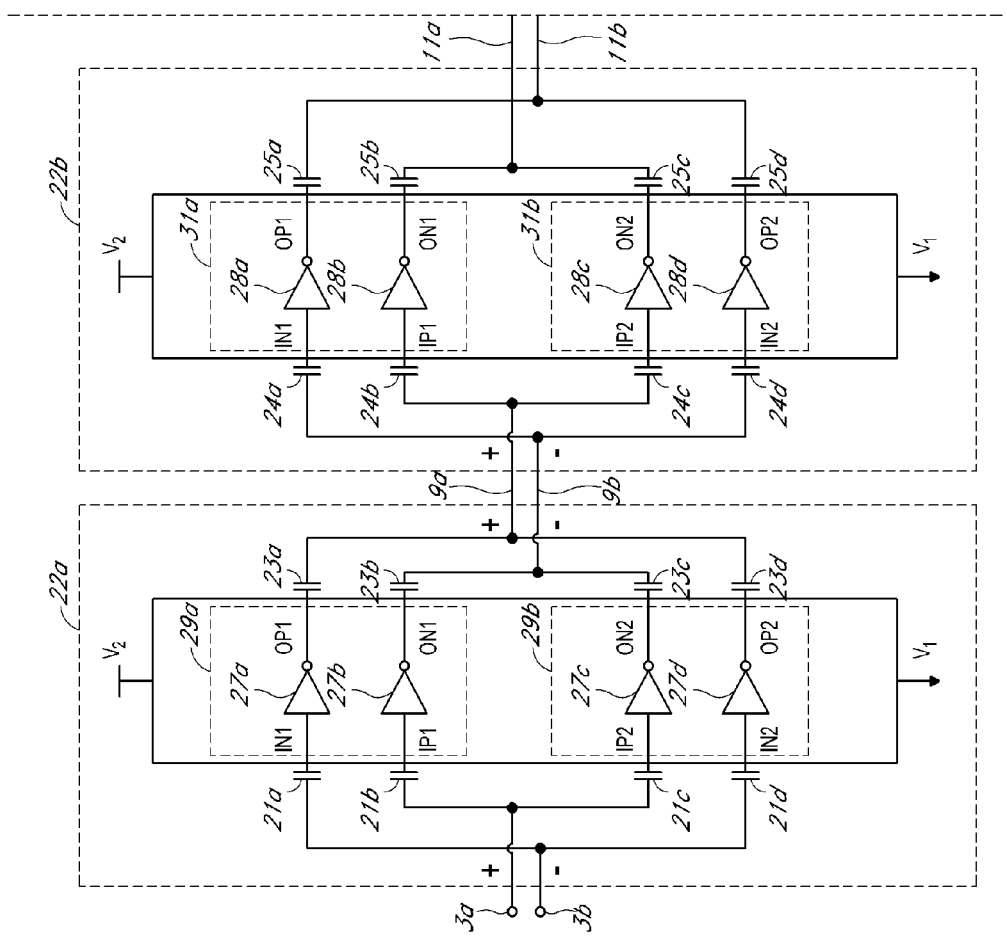
FIGS. 5A and 5B represent two parts of a single schematic diagram of an amplifier in accordance with another embodiment.
Figure 5B:
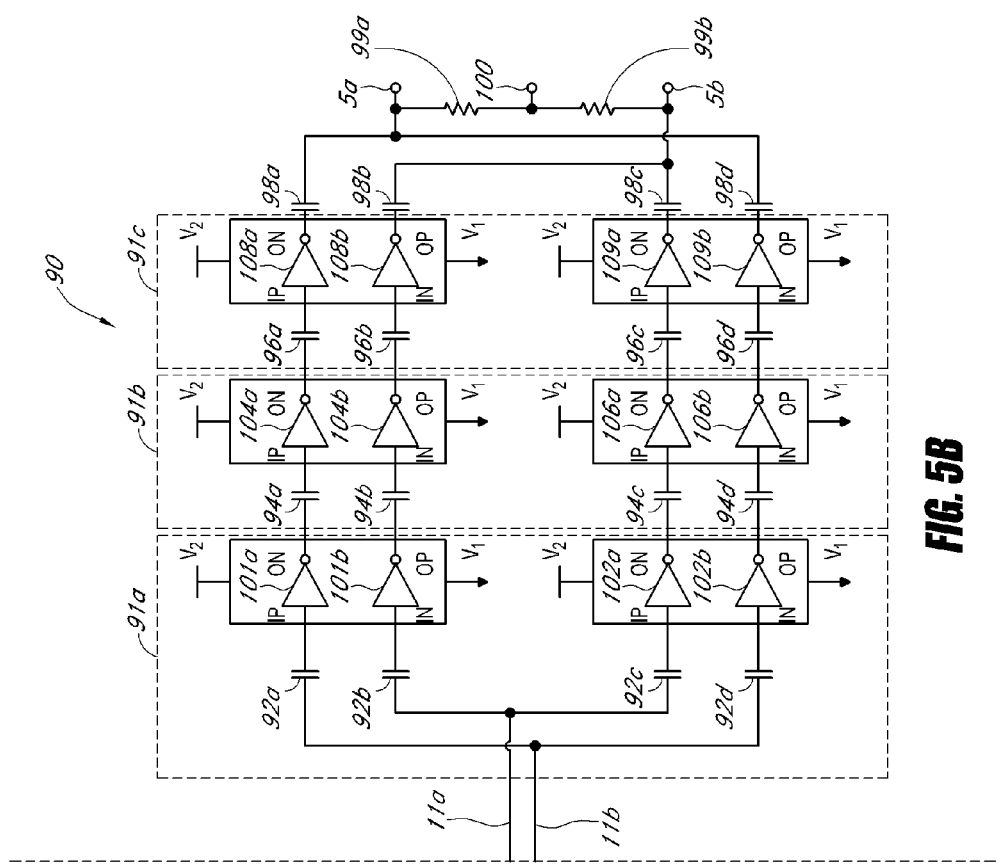

FIGS. 5A and 5B represents two parts of a single schematic diagram of an amplifier 90 in accordance with another embodiment. The amplifier 90 includes a first differential stacked amplifier stage 22a, a second differential stacked amplifier stage 22b, a first single-ended stacked amplifier stage 91a, a second single-ended stacked amplifier stage 91b, a third single-ended stacked amplifier stage 91c, capacitors 98a-98d and the resistors 99a, 99b. The first differential stacked amplifier stage 22a can be electrically coupled to non-inverted and inverted inputs 3a, 3b of the amplifier 20, and can generate first amplified non-inverted and inverted signals 9a, 9b. The second differential stacked amplifier stage 22b can amplify the first amplified non-inverted and inverted signals 9a, 9b to generate the second amplified non-inverted and inverted signals 11a, 11b. Additional details of the first and second differential stacked amplifier stages 22a, 22b can be as described above with respect to FIG. 3A. The single-ended stacked amplifier stages 91a-91c are cascaded end-to-end in series, with the first stacked amplifier stage 91a receiving the second amplified non-inverted and inverted signals 11a, 11b, and the third stacked amplifier stage 91c electrically coupled to the non-inverted and inverted outputs 5a, 5b of the amplifier 90.

The first single-ended stacked amplifier stage 91a includes capacitors 92a-92d, amplification subcircuits 101a, 101b, and amplification subcircuits 102a, 102b. The second single-ended stacked amplifier stage 91b includes capacitors 94a-94d, amplification subcircuits 104a, 104b, and amplification subcircuits 105a, 105b. The third single-ended stacked amplifier stage 91b includes capacitors 96a-96d, amplification subcircuits 108a, 108b, and amplification subcircuits 109a, 109b.

The capacitor 92a includes a first end configured to receive the inverted amplified signal 11b, and a second end electrically connected to an input of the amplification subcircuit 101a. The capacitor 92b includes a first end configured to receive the non-inverted amplified signal 11a, and a second end electrically connected to an input of the amplification subcircuit 101b. The capacitor 92c includes a first end configured to receive the non-inverted amplified signal 11a, and a second end electrically connected to an input of the amplification subcircuit 101c. The capacitor 92d includes a first end configured to receive the inverted amplified signal 11b, and a second end electrically connected to an input of the amplification sub circuit 101d.

The amplification subcircuits 101a, 101b are electrically connected in a stack between the voltage reference $V_2$ and the voltage reference $V_1$. A difference between the first and second voltage references $V_1$, $V_2$ can define a power supply voltage, and the amplification subcircuit 101a can operate over a first range of the power supply voltage while the amplification subcircuit 101b can operate over a second range of the power supply voltage. Similarly, the amplification subcircuits 102a, 102b are electrically connected in a stack between the first and second voltage references $V_1$, $V_2$, and the amplification subcircuit 102a can operate over the first range of the power supply voltage and the amplification subcircuit 102b can operate over the second range of the power supply voltage. Additional details of the amplification subcircuits can be as described below with reference to FIG. 6.

The capacitors 94a-94d each include a first end electrically connected to an output of the amplification subcircuits 101a, 101b, 102a, 102b, respectively, and a second end electrically connected to an input of the amplification subcircuits 104a, 104a, 105a, 105b, respectively. Similarly, the capacitors 96a-96d each include a first end electrically connected to an output of the amplification subcircuits 104a, 104b, 105a, 105b, respectively, and a second end electrically connected to an input of the amplification subcircuits 108a, 108b, 109a, 109b, respectively. The capacitors 98a-98d each include a first end electrically connected to an output of the amplification subcircuits 108a, 108b, 109a, 109b, respectively. The capacitor 98a includes a second end electrically connected to a second end of the capacitor 98d, to a first end of the resistor 99a, and to the non-inverted output 5a. The capacitor 98b includes a second end electrically connected to a second end of the capacitor 98c, to a first end of the resistor 99b, and to the inverted output 5b. The resistor 99a further includes a second end electrically connected to a second end of the resistor 99b to generate a common mode voltage output 100, which can have a voltage level equal to about the magnitude of the common mode voltage of the non-inverted and inverted outputs 5a, 5b.

The illustrated amplifier 90 includes a plurality of differential stacked amplifier stages 22a, 22b cascaded in an amplification chain with a plurality of single-ended stacked amplifier stages 91a-91c. As illustrated in FIGS. 5A and 5B, the differential stacked amplifier stages 22a, 22b have been used as first and second stages of the amplifier 90, and the single-ended stacked amplifier stages 91a-91c have been used as third, fourth, and fifth stages of the amplifier 90, respectively. In certain implementations, one or more differential stacked amplifier stages are provided before one or more single-ended stacked amplifier stages in a chain of amplifier stages. For example, a differential stacked amplifier stage can be provided as a first stage of an amplifier, and a single-ended stacked amplifier stage can be provided as a final stage of an amplifier. Since differential stacked amplifier stages can have a relatively greater common mode rejection ratio (CMRR) relative to single-ended stacked amplifier stages, using one or more differential stacked amplifier stage as input stages of an amplifier can aid in improving the CMRR of the amplifier. Additionally, since the DC current consumption and/or circuit area of a single-ended stacked amplifier stage can be less than that of a differential stacked amplifier stage having a similar gain, providing one or more single-ended stacked amplifier stages after the one or more differential stacked amplifier stages can aid in achieving a desired overall gain of the amplifier while reducing current consumption and/or circuit area relative to a design using only differential stacked amplifier stages. Furthermore, the combination of differential and single-ended stacked amplified stages can be used to provide a hard limited output voltage signal, such as a square wave suitable for switching a mixer, while maintaining a relatively high CMRR and a relatively small current relative to conventional schemes used to provide hard limited output voltage signals. Additionally, the inclusion of differential amplifier stages at the input of amplifier 90 improves the overall CMRR of the amplifier.

Figure 6:
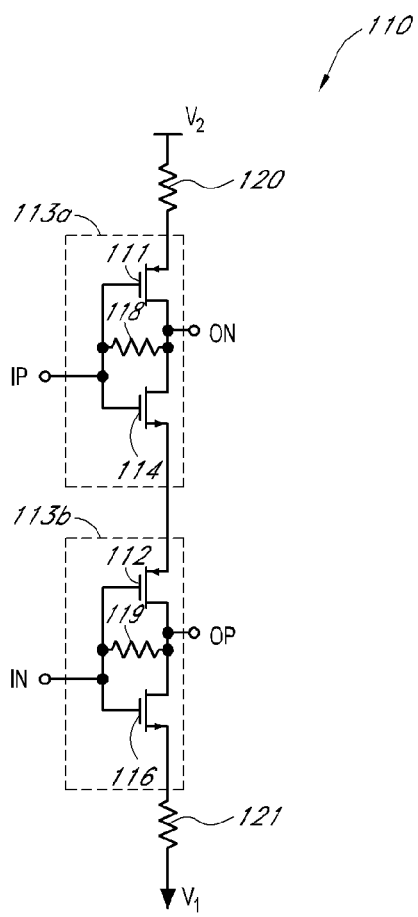
FIG. 6 is a circuit diagram of a portion of one example of a single-ended stacked amplifier stage.

FIG. 6 is a circuit diagram of one example of a portion of a single-ended stacked amplifier stage 110. The illustrated circuit includes a first amplification subcircuit 113a, a second amplification subcircuit 113b, a first bias resistor 120, and a second bias resistor 121. The circuit shown in FIG. 6 can be used, for example, in the first, second, and third single-ended stacked amplifier stages 91a-91c of FIGS. 5A and 5B.

The first amplification subcircuit 113a includes a first PMOS transistor 111, a first NMOS transistor 114, and a first resistor 118. The second amplification subcircuit 113b includes a second PMOS transistor 112, a second NMOS transistor 115, and a second resistor 119. The first and second PMOS transistors 111, 112 and the first and second NMOS transistors 114, 115 each include a gate, a drain, and a source.

The gate of the first PMOS transistor 111 is electrically connected to a first end of the first resistor 118 and to the gate of the first NMOS transistor 114 at the input of the first amplification subcircuit 113a or IP. The drain of the first PMOS transistor 111 is electrically connected to a second end of the first resistor 118 and to the drain of the first NMOS transistor 114 at the output of the first amplification subcircuit 113a or ON. Similarly, the gate of the second PMOS transistor 112 is electrically connected to a first end of the second resistor 119 and to the gate of the second NMOS transistor 115 at the input of the second amplification subcircuit 113b or IN. The drain of the second PMOS transistor 112 is electrically connected to a second end of the second resistor 119 and to the drain of the second NMOS transistor 115 at the output of the second amplification subcircuit 113b or OP.

The source of the first PMOS transistor 111 is electrically connected to a first end of the first bias resistor 120. The first bias resistor 120 further includes a second end electrically connected to the second voltage reference $V_2$. The source of the second NMOS transistor 115 is electrically connected to a first end of the second bias resistor 121. The second bias resistor 121 further includes a second end electrically connected to the first voltage reference $V_1$. To aid in providing similar operation for the amplification subcircuits in both the top and bottom of the stack, in certain implementations the NMOS and PMOS transistors can have bodies biased at similar voltages. For example, the bodies of PMOS transistors 111, 112 can be electrically connected to the sources of the PMOS transistors 111, 112, respectively, and a triple well or other suitable process can be used to electrically connect the body of the first NMOS transistor 114 to the source of the first NMOS transistor 114 and to electrically connect the body of the second NMOS transistor 115 to the source of the second NMOS transistor 115.

Figure 7:
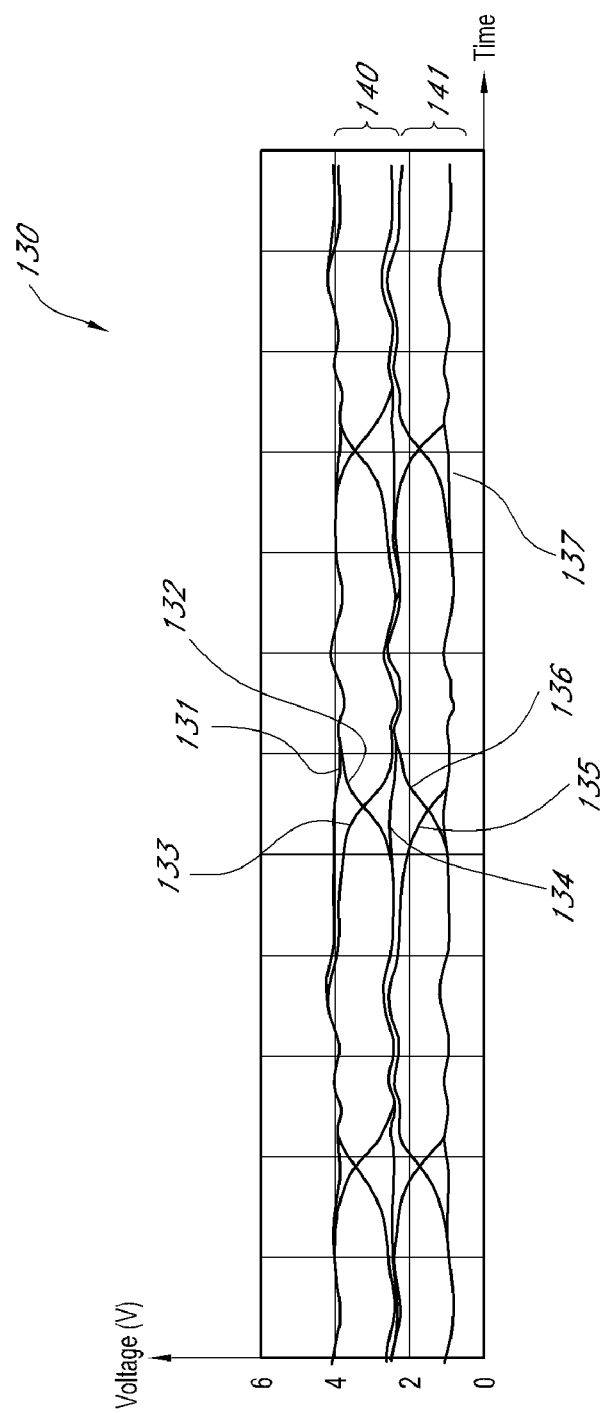
FIG. 7 illustrates the results of a transient voltage simulation for one example of a differential stacked amplifier stage.

FIG. 7 illustrates the results of a transient voltage simulation 130 for one example of a differential stacked amplifier stage. The simulation 130 includes first through seventh waveforms 131-137. The simulation 130 can correspond to one implementation of the differential stacked amplifier stage 40 of FIG. 4A. For example, the first waveform 131 can correspond to a waveform of the node $N_1$, the second waveform 132 can correspond to a waveform of the output of the first amplification subcircuit 37a or OP1, the third waveform 133 can correspond to a waveform of the output of the second amplification subcircuit 37b or ON1, the fourth waveform 134 can correspond to a waveform of the node $N_3$, the fifth waveform 135 can correspond to a waveform of the output of the third amplification subcircuit 37c or ON2, the sixth waveform 136 can correspond to a waveform of the output of the fourth amplification subcircuit 37d or OP2, and the seventh waveform 137 can correspond to a waveform of the node $N_2$. As illustrated in FIG. 7, the first and second amplification subcircuits can operate over a first range of voltage 140 and the third and fourth amplification subcircuits can operate over a second range of voltage 141.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. For example, amplifiers having stacked amplification subcircuits can be used in wireless infrastructure for cellular base stations and/or in circuits for radio links, receiver mixer chains, digital predistortion transmitter observation receivers, and/or other RF applications. Examples of the electronic devices can also include consumer electronic products, parts of the consumer electronic products, electronic test equipment, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
    a first stacked differential amplifier stage having a non-inverted input, an inverted input, a non-inverted output and an inverted output, the amplifier stage comprising:
        a first amplification subcircuit;
        a second amplification subcircuit;
        a third amplification subcircuit; and
        a fourth amplification subcircuit, wherein the first and second amplification subcircuits are arranged as a first differential amplification block, and the third and fourth amplification subcircuits are arranged as a second differential amplification block; and
    a bias circuit for powering the first and second differential amplification blocks, the bias circuit configured to operate as a current source for each of the first and second differential amplification blocks,
    wherein each amplification subcircuit is configured to receive an input signal as an input and to generate an amplified version of the input signal as an output, and wherein the first and second amplification subcircuits are electrically powered in the first differential amplification block and the third and fourth amplification subcircuits are electrically powered in the second differential amplification block such that the first and second amplification subcircuits operate from a first portion of a power supply voltage and the third and fourth amplification subcircuits operate from a second portion of the power supply voltage, wherein the second portion is different from the first portion;
    wherein the inputs of the first and fourth amplification subcircuits are electrically connected to the inverted input, and the inputs of the second and third amplification subcircuits are electrically connected to the non-inverted input, and wherein the outputs of the first and fourth amplification subcircuits are electrically connected to the one of the non-inverted output or the inverted output, and the outputs of the second and third amplification subcircuits are electrically connected to the other one of the inverted output or the non-inverted output.

2. The apparatus of claim 1, further comprising a first plurality of DC blocking capacitors, wherein a first blocking capacitor of the first plurality of DC blocking capacitors is disposed in a signal path between the inverted input and the input of the first amplification subcircuit, and wherein a second blocking capacitor of the first plurality of DC blocking capacitors is disposed in a signal path between the inverted input and the fourth amplification subcircuit, and wherein a third blocking capacitor of the first plurality of DC blocking capacitors is disposed in a signal path between the non-inverted input and the second amplification subcircuit, and wherein a fourth block capacitor of the first plurality of DC blocking capacitors is disposed in a signal path between the non-inverted input and the input of the third amplification subcircuit.

3. The apparatus of claim 2, further comprising a second plurality of DC blocking capacitors, wherein the second plurality of DC blocking capacitors electrically connect the outputs of the first and fourth amplification circuits to the non-inverted output, and the outputs of the second and third amplification circuits to the inverted output.

4. The apparatus of claim 1, wherein the first amplification subcircuit comprises a first PMOS transistor and a first NMOS transistor, wherein the first PMOS and first NMOS transistors each has a gate electrically connected to the input of the first amplification and a drain electrically connected to the output of the first amplification subcircuit.

5. The apparatus of claim 1, wherein the first amplification subcircuit further comprises a first resistor having a first end and a second end, the first end electrically connected to the gates of the first PMOS and first NMOS transistors, and the second end electrically connected to the sources of the first PMOS and first NMOS transistors.

6. The apparatus of claim 5:
    wherein the second amplification subcircuit further comprises a second PMOS transistor, a second NMOS transistor, and a second resistor, the second PMOS and second NMOS transistors each has a gate electrically connected to the input of the second amplification subcircuit and to a first end of the second resistor and a drain electrically connected to the output of the second amplification subcircuit and to a second end of the second resistor, and
    wherein the third amplification subcircuit further comprises a third PMOS transistor, a third NMOS transistor, and a third resistor, the third PMOS and third NMOS transistors each has a gate electrically connected to the input of the third amplification subcircuit and to a first end of the third resistor and a drain electrically connected to the output of the third amplification subcircuit and to a second end of the third resistor, and
    wherein the fourth amplification subcircuit further comprises a fourth PMOS transistor, a fourth NMOS transistor, and a fourth resistor, the fourth PMOS and fourth NMOS transistors each has a gate electrically connected to the input of the fourth amplification subcircuit and to a first end of the fourth resistor and a drain electrically connected to the output of the fourth amplification subcircuit and to a second end of the fourth resistor.

7. The apparatus of claim 6, wherein the first, second, third and fourth NMOS transistors and the first, second, third and fourth PMOS transistors each further has a source, wherein the source of the first PMOS transistor is electrically connected to the source of the second PMOS transistor, wherein the source of the third NMOS transistor is electrically connected to the source of the fourth NMOS transistor, and wherein the source of the first NMOS transistor is electrically connected to the source of the first NMOS transistor, to the source of the third PMOS transistor, and to the source of the fourth PMOS transistor.

8. The apparatus of claim 7, wherein the bias circuit comprises a first bias resistor and a second bias resistor, the first bias resistor having a first end electrically connected to a first voltage reference and a second end electrically connected to the sources of the first and second PMOS transistors, wherein the second bias resistor has a first end electrically connected to a second voltage reference and a second end electrically connected to the sources of the third and fourth NMOS transistors, wherein a difference between the first and second voltage references defines the power supply voltage.

9. The apparatus of claim 7, wherein the bias circuit includes a first bias node for biasing the sources of the first and second PMOS transistors and a second bias node for biasing the sources of the third and fourth NMOS transistors, and wherein the bias circuit generates a bias current from the first bias node to the second bias node, and wherein the bias current is used to bias the first and second amplification subcircuits, and wherein at least a portion of the bias current is also used to bias the third and fourth amplification subcircuits.

10. The apparatus of claim 1, further comprising a second stacked differential amplifier stage having a non-inverted input, an inverted input, a non-inverted output and an inverted output, the amplifier stage comprising a fifth amplification subcircuit, a sixth amplification subcircuit, a seventh amplification subcircuit, and an eighth amplification subcircuit, wherein each amplification subcircuit of the second stacked differential amplifier stage is configured to receive an input signal as an input and to generate an amplified version of the input signal as an output, wherein the inputs of the fifth and eighth amplification subcircuits are electrically connected to the inverted input of the second stacked differential amplifier stage and to one of the inverted output or the non-inverted output of the first stacked differential amplifier stage, and wherein the inputs of the second and third amplification subcircuits are electrically connected to the non-inverted input of the second stacked differential amplifier stage and to the other of the non-inverted output or the inverted output of the first stacked differential amplifier stage, and wherein the outputs of the fifth and eighth amplification subcircuits are electrically connected to one of the non-inverted output or the inverted output of the second stacked differential amplifier stage, and the outputs of the sixth and seventh amplification subcircuits are electrically connected to the other of the inverted output or the non-inverted output of the second stacked differential amplifier stage.

11. The apparatus of claim 10, further comprising a first single-ended stacked amplifier stage comprises a non-inverted input, an inverted input, a non-inverted output, and an inverted output, the non-inverted input electrically connected to the non-inverted output of the second differential stacked amplifier stage, and the inverted input electrically connected to the inverted output of the second differential stacked amplifier stage.

12. The apparatus of claim 11, wherein the non-inverted input of the first differential stacked amplifier stage is configured to receive a clock signal from a local oscillator, and wherein the inverted input of the first differential amplifier stage is electrically connected to a voltage reference.

13. The apparatus of claim 12, further comprising a mixer, wherein the first differential stacked amplifier stage, the second differential stacked amplifier stage, and the first single-ended stacked amplifier stage are configured to generate an amplified differential clock signal for the mixer.

14. A method for amplifying a signal, the method comprising:
providing a first differential amplification block;
providing a second differential amplification block;
electrically coupling the first and second differential amplification blocks in series between a first voltage reference and a second voltage reference, wherein a voltage difference between the first and second voltage references defines a power supply voltage;
amplifying a first signal using the first differential amplification block;
amplifying a second signal using the second differential amplification block; and
biasing the first differential amplification block using a first bias current and biasing the second differential amplification block using at least a portion of the first bias current
wherein the first differential amplification block operates over a first range of the power supply voltage and the second differential amplification block operates over a second range of the power supply voltage, wherein the second range is different from the first range.

15. The method of claim 14, further comprising receiving a single-ended clock signal from a local oscillator.

16. The method of claim 15, further comprising amplifying the single-ended clock signal using at least the first and second differential amplification blocks to generate an amplified differential clock signal.

17. The method of claim 16, further comprising providing the amplified differential clock signal to a mixer.

18. The method of claim 14, wherein the first differential amplification block comprises a first input, a second input, a first output, a second output, a first NMOS transistor, a second NMOS transistor, a first PMOS transistor, and a second PMOS transistor, wherein the first NMOS and first PMOS transistors each has a gate electrically connected to the first input and a drain electrically connected to the first output, and wherein the second NMOS and second PMOS transistors each has a gate electrically connected to the second input and a drain electrically connected to the second output.

19. The method of claim 18, wherein the second differential amplification block comprises a first input, a second input, a first output, a second output, a third NMOS transistor, a fourth NMOS transistor, a third PMOS transistor, and a fourth PMOS transistor, wherein the third NMOS and third PMOS transistors each has a gate electrically connected to the first input of the second differential amplification block and a drain electrically connected to the first output of the second differential amplification block, and wherein the fourth NMOS and fourth PMOS transistors each has a gate electrically connected to the second input of the second differential amplification block and a drain electrically connected to the second output of the second differential amplification block.

20. The method of claim 19, wherein the first and second PMOS transistors each has a source electrically connected to a first node, and wherein the third and fourth NMOS transistors each has a source electrically connected to a second node, and wherein the first NMOS, second NMOS, third PMOS, and fourth PMOS transistors each has a source electrically connected to a third node.

21. The method of claim 14, wherein biasing the first differential amplification block using a first bias current and biasing the second differential amplification block using at least a portion of the first bias current comprises electrically connecting a first resistor between the first voltage reference and the first differential amplification block and electrically connecting a second resistor between the second voltage reference and the second differential amplification block.

* * * * *